United States Patent [19]

Araki et al.

[11] Patent Number: 6,136,090
[45] Date of Patent: Oct. 24, 2000

[54] METHOD FOR PRODUCING A SILICON SINGLE CRYSTAL

[75] Inventors: Kenji Araki; Hideo Okamoto, both of Gunma-ken; Toshiharu Uesugi, Fukushima-ken, all of Japan; Atsushi Iwasaki, Vancouver, Wash.

[73] Assignee: Shin-Etsu Handotai Co., Ltd., Tokyo, Japan

[21] Appl. No.: 09/249,410

[22] Filed: Feb. 12, 1999

[30] Foreign Application Priority Data

Feb. 13, 1998 [JP] Japan .................................. 10-048658

[51] Int. Cl.$^7$ ...................................... C30B 15/18
[52] U.S. Cl. .............................. 117/13; 117/217
[58] Field of Search ..................... 117/13, 14, 15, 117/20, 217

[56] References Cited

U.S. PATENT DOCUMENTS 3,621,213  11/1971  Jen et al. .
5,089,238   2/1992  Araki et al. .
5,096,677   3/1992  Katsuoka et al. .
5,264,189  11/1993  Yamashita et al. ...................... 117/222
5,551,978   9/1996  Akashi et al. ........................... 117/222

*Primary Examiner*—Felisa Hiteshew
*Attorney, Agent, or Firm*—Hogan & Hartson LLP

[57] ABSTRACT

A method of producing a single crystal by Czochralski method by contacting a seed crystal with a melt in a crucible, and then pulling it slowly to grow a single crystal ingot, wherein a pulling condition is controlled according to a cumulative time of use of a heater surrounding the crucible. The pulling conditions to be controlled may induce the relative position of the heater and the crucible, the number of rotations of the crucible, the number of rotations of the crystal, or an atmosphere pressure in the furnace and a gas volume of flowing. Also described is a method of producing a silicon single crystal by CZ method wherein a dispersion of impurity concentration in the crystal can be reduced, and a single crystal can be produced stably.

10 Claims, 7 Drawing Sheets

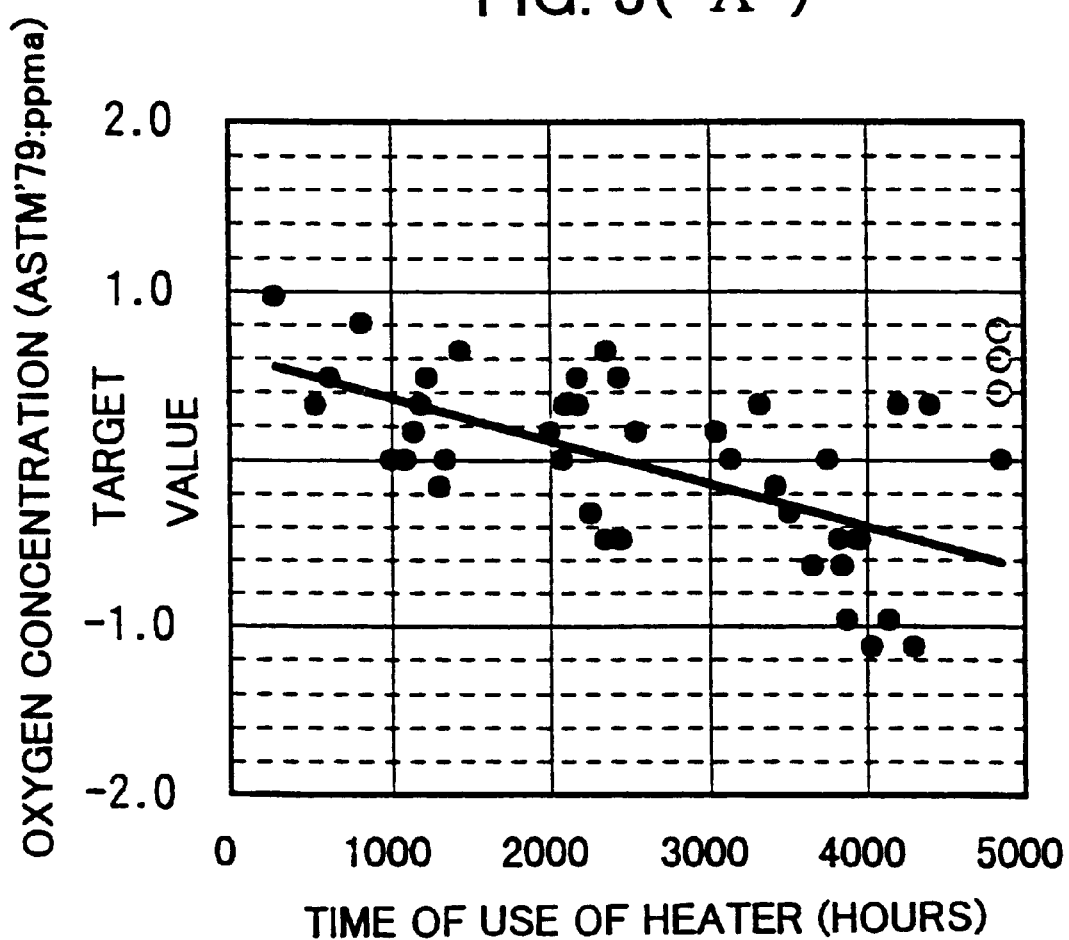

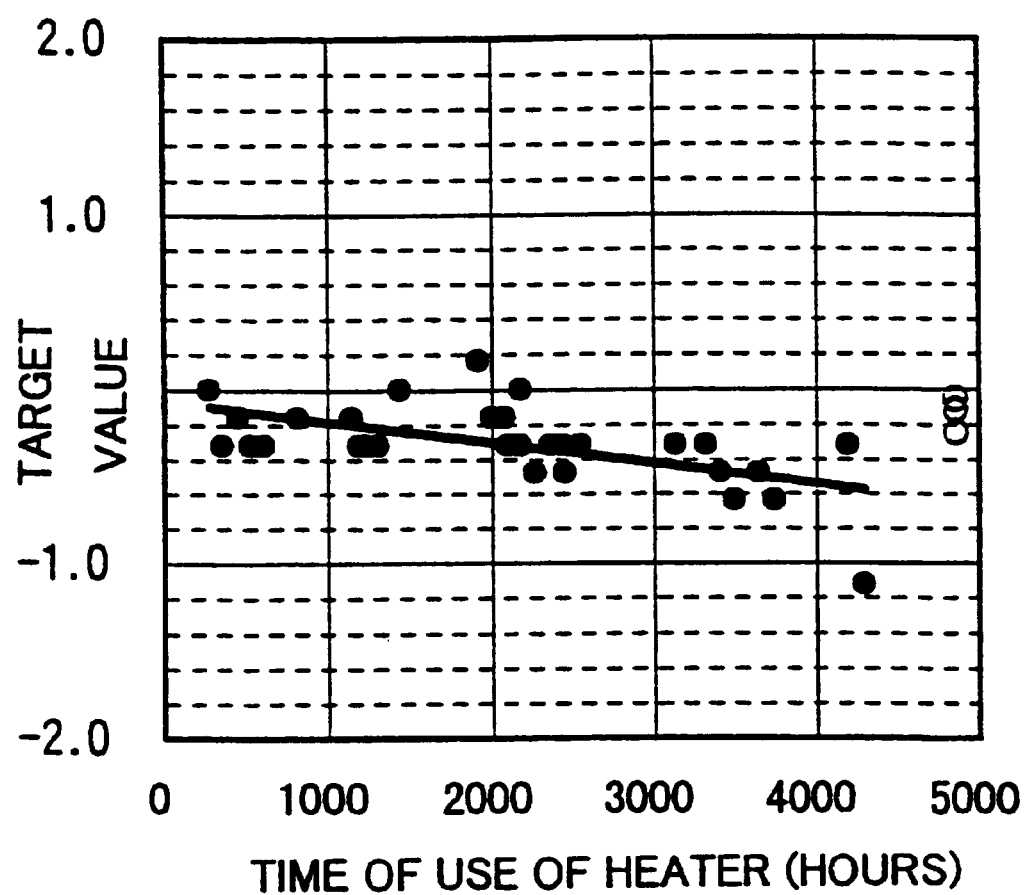

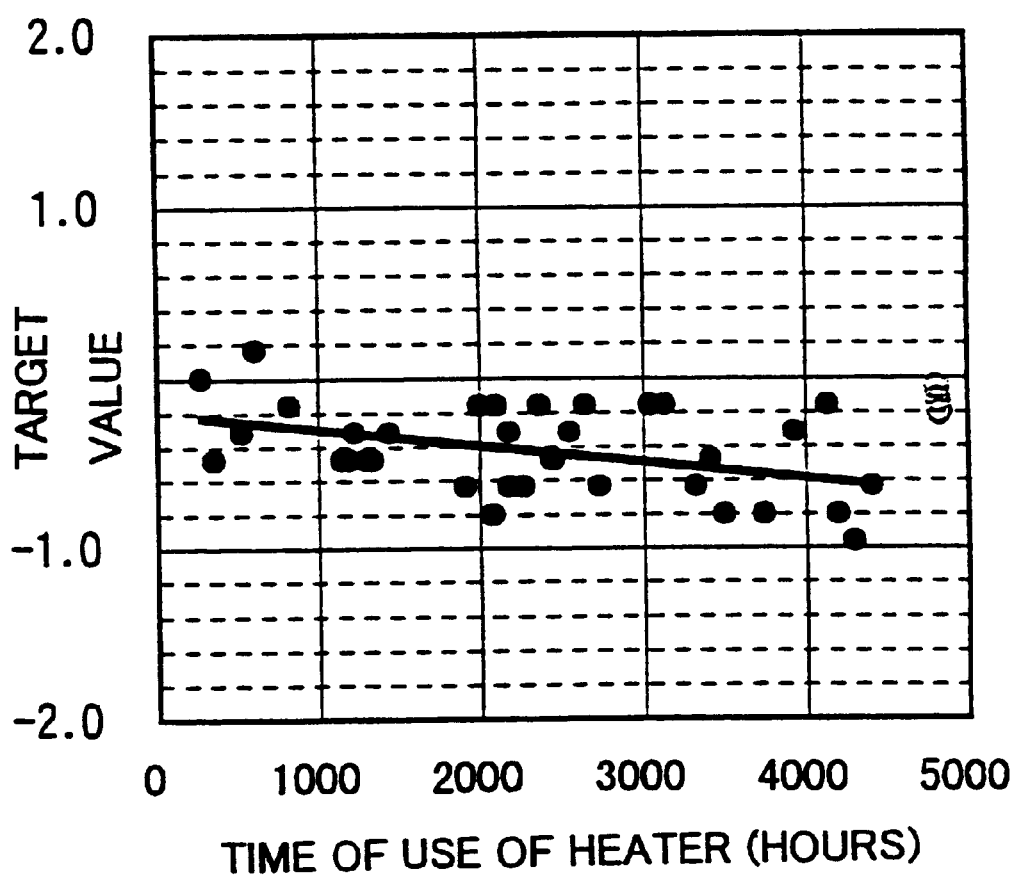

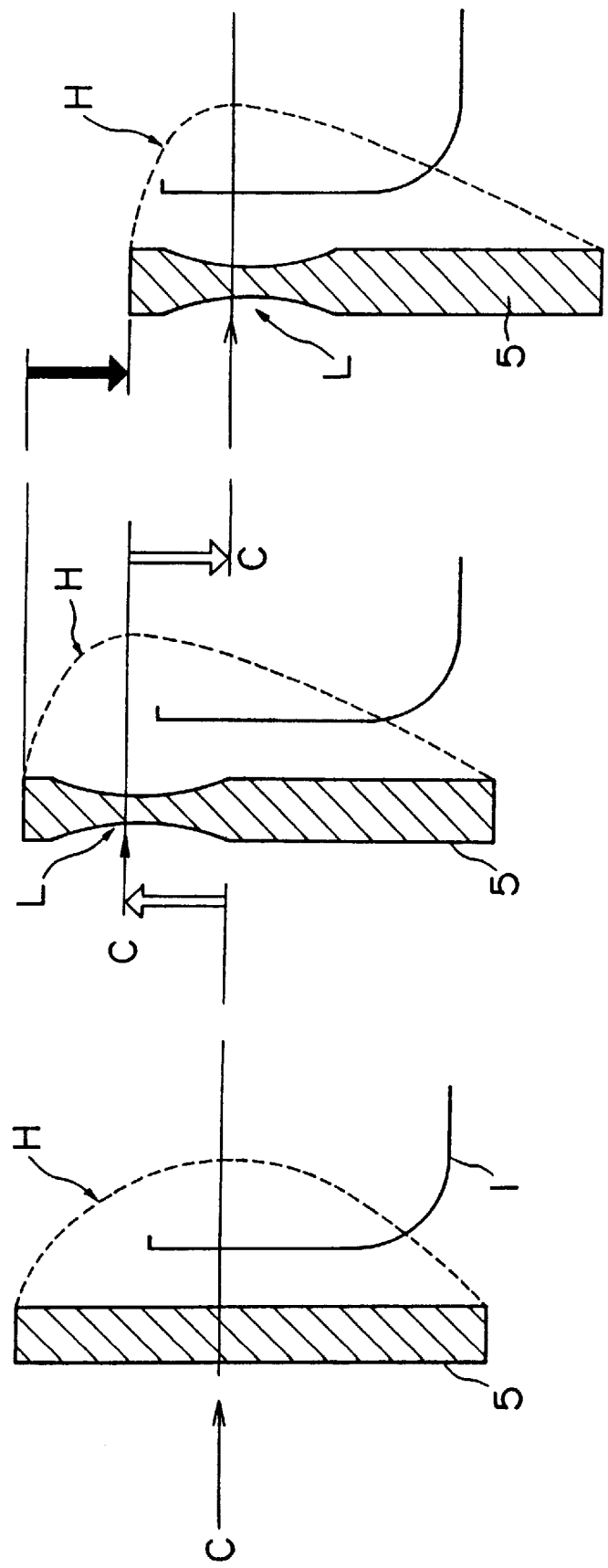

METHOD FOR PRODUCING A SILICON SINGLE CRYSTAL

BACKGROUND OF THE INVENTION

1. Field of the Invention

The present invention relates to a method for producing a silicon single crystal ingot for, for example, a silicon semiconductor and the like, by Czochralski method.

2. Description of the Related Art

The apparatus as shown in FIG. 1 has been conventionally used for producing, for example, a silicon single crystal by Czochralski method (hereinafter occasionally referred to as CZ method). In FIG. 1, a quartz crucible 1 contains a silicon melt 2, and can rotate and move vertically along a crucible-holding shaft 3. A servomotor 4 drives the crucible, of which the number of rotation can be controlled. A cylindrical heater 5 made of, for example, graphite, is arranged around the crucible 1. The heater 5 has slits 20 formed vertically, and from the top and from the bottom by turns, namely zigzag, as shown in FIG. 2 and the zigzag arrangement of slits composes heat generator. The heater 5 is supplied with electricity through electrodes 12, which can be moved vertically with a driving motor 13, so that the heater 5 can be moved vertically to control the relative position of the heater to the crucible. A heat-insulating cylinder 11 is arranged around the heater 5.

Recently, there is occasionally performed MCZ method wherein a magnetic field is applied to a melt as Czochralski method. As shown in FIG. 1, a magnetic field generator 7 comprising a permanent magnet or an electromagnet is arranged outside a chamber 6 of the apparatus. Numeral 8 indicates a seed crystal 8 consisting of a single crystal silicon. The seed crystal and a single crystal ingot can be pulled with a pulling mechanism 9 with rotating around a center axis thereof. While the crystal is pulled, inert gas is introduced from a gas inlet 14 provided at upper part of the chamber 6 and exhausted from an exhaust hole 15 provided at lower part of the chamber 6 with a vacuum pump 16, and thereby amounts of inflow and outflow of the introduced gas are controlled to control an atmosphere pressure in the furnace. The silicon single crystal ingot 10 is thus produced by CZ method.

It is well known that not only components of the raw material but also the constituent ingredient of the crucible which contains the raw material for crystal growth, for example, a quartz crucible (for example, oxygen) are mixed in the crystal thus produced, while the crystal is grown by the CZ method.

The amount of the impurities which are mixed in the crystal depends on the number of rotation of the pulled crystal (rate of rotation), the number of rotation of the crucible, temperature distribution in raw material melt, gas atmosphere in the furnace, or the like. This is because the number of rotation of the crystal affects convection of the melt or an amount of impurities which are mixed in the crystal, the number of rotation of the crucible affects convection of the melt and a concentration of impurities itself in the melt as a result of change in a dissolving rate of the crucible, the temperature distribution in raw material melt, especially a relative position of the heater to the crucible affects convection in the melt. The gas atmosphere in the furnace affects an amount of evaporation of impurities from the surface of the melt. Accordingly, the concentration of the impurities in the crystal can be controlled by controlling these factors.

In recent years, requirements for a single crystal material have been getting more severe because of increase of precision and increase of integration degree of a device such as a semiconductor. It is known that impurity concentration in crystal, for example, the concentration and the distribution of oxygen in a semiconductor silicon single crystal greatly affect characteristics of a semiconductor device obtained from the silicon single crystal. Namely, too high oxygen concentration results in generation of crystal defects and oxide precipitates, which may lead to various harmful effects on characteristics of a semiconductor device. However, when such crystal defects or oxide precipitates is generated outside an active area of the semiconductor device, they act as a site of gettering heavy metal impurity, and can improve characteristics of the semiconductor device (Intrinsic gettering). Accordingly, generally too low oxygen concentration does not lead to improvement of characteristics of a device either.

Accordingly, it is necessary that intended impurities are present in crystal material in a proper amount, namely neither too much nor too little. The acceptable range of the concentration has been getting very narrow. Simple control of the above mentioned factors may result in large dispersion of the concentration, and therefore desirable concentration of impurities cannot be achieved, and thus it is not sufficient for controlling a concentration of impurities in a crystal strictly, or for satisfying the requirements. Particularly, in the case of mass production of single crystal using a lot of pulling apparatuses, a large dispersion of the impurity concentration may be generated, even though crystals are grown in completely the same condition.

SUMMARY OF THE INVENTION

The present invention has been accomplished to solve the above-mentioned problems, and an object of the present invention is to provide a method of producing a single crystal by CZ method wherein a dispersion of impurity concentration in the crystal can be reduced, and to produce a single crystal stably.

To achieve the above mentioned object, the present invention provides a method of producing a single crystal by Czochralski method comprising contacting a seed crystal with a raw material melt in a crucible, and then pulling it slowly to grow a single crystal ingot wherein a pulling condition is controlled according to time of use of a heater surrounding said crucible.

Namely, the inventors have found that a dispersion of concentration of impurity mixed in the crystal as mentioned above is closely related to a cumulative time of use of a heater. Accordingly, dispersion of impurity concentration in a crystal can be reduced and a crystal can be grown stably by controlling a crystal pulling condition according to time of use of a heater.

In an embodiment of the present invention, said pulling condition to be controlled is at least one of relative position of a heater and a crucible, the number of rotation of a crucible, the number of rotation of a crystal, an atmosphere pressure in a furnace and a gas volume of flowing in a method of producing a single crystal by Czochralski method.

The impurity concentration in a crystal can be controlled precisely and desirably by controlling the factors affecting an impurity concentration according to time of use of a heater as above. Accordingly, a dispersion of the impurity concentration can be surely reduced.

Preferably, the pulling condition is controlled by lowering a relative position of the heater to the crucible according to time of use of a heater. The relative position of the heater to the crucible is preferably lowered by lowering the position of the heater.

When the control according to time of use of the heater is performed by lowering a relative position of the heater to the crucible as described above, not only reduction of dispersion of impurity concentration, but also stabilization of growth of crystal can be achieved, since the temperature distribution and convection of the melt can be almost the same as the original state thereof.

It is convenient to control the relative position not by raising the crucible but by lowering the heater, since the position of the surface of the melt is not changed in the latter case, so that the intended purpose can be achieved without affecting the other condition such as control of a diameter or the like.

When the relative position of the heater to the crucible is lowered, it is preferable that it is controlled in a larger amount in the first half time of crystal growth.

This is because the influence of time of use of the heater on the impurity concentration in the crystal and the influence of the relative position of the heater to the crucible are larger in the first half time or early stage of crystal growth in which the crucible contains a large amount of melt.

In the present invention, a single crystal is grown by CZ method, controlling a pulling condition according to time of using a heater, and thus dispersion of impurity concentration in a crystal, which is caused by deterioration of the heater can be reduced. Particularly, when a silicon single crystal is grown by CZ method, not only reduction of a dispersion of oxygen concentration in the crystal, but also stable manufacture of single crystal can be achieved.

BRIEF DESCRIPTION OF THE DRAWINGS

FIG. 3 is a graph showing a change of oxygen concentration according to time of use of a heater.

(A) shows a data of the seed-end portion of the crystal.

(B) shows a data of the center portion of the crystal.

(C) shows a data of the tail portion of the crystal.

FIG. 4 is an explanatory view showing a relationship between the exotherm distribution and exotherm center and a relative position of the heater to the crucible.

(A) shows the case that new heater is used.

(B) shows the case that deteriorated heater is used.

(C) shows the case that exotherm center shifted downward is corrected by lowering a heater.

Figure 5:
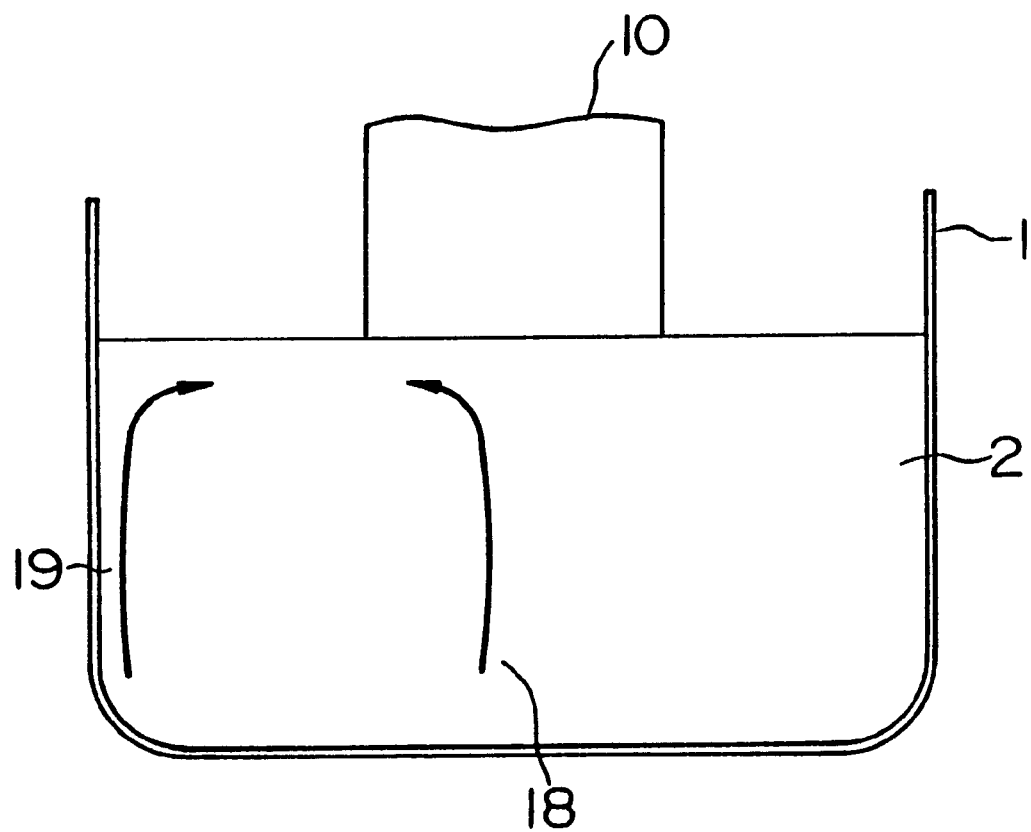

FIG. 5 is an explanatory view showing a convection of a melt in a crucible.

DESCRIPTION OF THE INVENTION AND A PREFERRED EMBODIMENT

The present invention will be further described below in detail, giving an example of manufacturing a semiconductor silicon single crystal from a silicon melt, but is not limited thereto.

A quartz crucible is generally used as a crucible containing a raw material melt in manufacture of silicon single crystal by CZ method. Accordingly, oxygen which is a constituent of the quartz is mixed in the grown crystal, and therefore oxygen concentration should be controlled precisely.

The inventors of the present invention have investigated and found that a dispersion of oxygen concentration in the silicon crystal among crystals and apparatuses for manufacture is large, even though the factors affecting oxygen concentration such as relative position of a heater and a crucible, the number of rotation of a crucible, the number of rotation of a crystal, and a gas atmosphere in a furnace as described above are precisely controlled in CZ method.

The inventors have thoroughly investigated and found that a dispersion of concentration of oxygen as impurity mixed in the crystal is closely related to a cumulative time of use of a heater. They have thought of reducing the dispersion of oxygen concentration in the crystal and stabilizing crystal growth by controlling the pulling condition of crystal according to the time of use of a heater to complete the present invention.

Namely, the inventors have considered that dispersion of oxygen concentration is caused by deterioration as a result of use of a heater, and tried to plot oxygen concentration in single crystal ingots pulled in completely the same condition according to each cumulative time of use of a heater.

The results are shown in FIG. 3. FIG. 3 shows a relationship between time of use of a heater and oxygen concentration measured at the seed-end portion (FIG. 3 (A)), the center portion (FIG. 3(B)), and the tail portion (FIG. 3(C)) of a silicon single crystal ingot having a diameter of 6 inches and a weight of 40 kg manufactured by feeding 50 kg of polycrystal silicon melt to a quartz crucible having a bore diameter of 18 inches and pulling a silicon single crystal ingot from the crucible.

As shown in FIG. 3, it is apparent that oxygen concentration in the silicon single crystal decreases with increase of time of use of a heater. The concentration tends to decrease more in the seed-end portion of the grown single crystal ingot, and less in the tail portion thereof.

The reason for the above tendency can be considered as follows. Generally, a heater consists of carbon materials such as graphite, and the shape of section of slits formed in zigzag pattern is kept the same as the designed shape as shown in FIG. 4(A) at first. Accordingly, in a heater 5 having symmetric shape such as shown in FIG. 4(A), exotherm center C is approximately in the center of the slit, so that heat distribution H is also symmetric up and down. The melt in the crucible 1 is also affected by the temperature distribution in accordance with the exothermo distribution H of the heater 5.

However, with using the heater for a long time, SiO gas which is generated by the reaction of the silicon melt and the quartz crucible, and then evaporated and scattered from the surface of the silicon melt comes in contact with the carbon heater 5, resulting in gradual deterioration of the heater 5. Namely, SiO reacts with carbon to form CO, and thus the heater slit gradually becomes thin, as shown in FIG. 4(B). The above thin part L is formed, especially around the upper part of the heater with which SiO generated from the crucible comes into contact first. As a result, a resistance of the thin part L increases, and exotherm center C of the heater is shifted upwardly, the heat distribution H becomes asymmetric up and down, namely the upper part is heated more.

As described above, if the heat distribution of the heater 5 is changed, temperature distribution of the silicon melt is changed as a matter of course, and convection of the melt is changed. As a result, oxygen concentration is lowered.

The reason why oxygen concentration in the single crystal is lowered when the heat distribution of the heater 5 is shifted upwardly can be explained as follows referring to FIG. 5. Namely, it is generally considered that a convection in the silicon melt 2 can be classified roughly into two types, a forced convection 18 and a natural convection 19. If the forced convection 18 gets strong, the convection does not come into contact with the surface of the melt, and therefore, SiO can reach the grown single crystal ingot 10 without being evaporated, and oxygen concentration in the crystal increases. On the other hand, it is known that oxygen concentration in the crystal is decreased in the case that the natural convection 19 gets strong because the convection reaches the crystal with evaporating SiO at the surface of the melt.

Accordingly, if the heater 5 is deteriorated as a result of use, and the heat distribution is shifted upwardly, the natural convection 19 in the silicon melt gets stronger, and the forced convection 18 gets weaker, and thereby oxygen concentration in the crystal is lowered.

In order to compensate such decrease of oxygen concentration caused by increase of time of use of the heater as mentioned above, time of use of heater is monitored, and pulling condition affecting oxygen concentration is controlled according to the value.

Namely, when a tendency of decrease of oxygen concentration according to time of use of a heater in the operating conditions as shown in FIGS. 3(A) to (C) is predetermined, and thereby time of use of a heater is forecastable, the amount of oxygen concentration decreased from desirable value can be known in advance. Accordingly, a pulling condition affecting oxygen concentration can be controlled to increase oxygen concentration corresponding to the value.

As explained above, dispersion of oxygen concentration mixed in the crystal can be reduced.

Examples of the pulling condition to be controlled in order to increase an oxygen concentration include relative position of a heater and a crucible, a rotation number of a crucible, a rotation number of a crystal, an atmosphere pressure in a furnace and a gas volume of flowing.

Although there may be methods for increase of oxygen concentration other than the method of controlling the above factors, for example, a method of changing or adding members in a furnace, it is preferable to control the above-mentioned pulling condition, in order to enable precise correction of oxygen concentration by an easy and sure method.

In order to control the pulling condition, at least one of the above-mentioned factors are controlled. Only one factor may be controlled to compensate all of decrease of oxygen concentration, or two or more factors may be controlled in order to reduce influence of each factor.

Influence of the above-mentioned pulling condition on the oxygen concentration is described above, however, it further explained below. The number of rotation of the crystal affects convection in the melt or amount of oxygen mixed in the crystal. With larger number of rotation of the crystal, the forced convection 18 shown in FIG. 5 gets stronger, and a boundary diffusion layer in a crystal growth interface gets thinner so that oxygen is mixed in the crystal more easily. Accordingly, an oxygen concentration can be controlled to be constant by increasing the rotation number of crystal according to the time of use of the heater.

The rotation number of the crucible affects convection in the melt and a dissolving rate of the crucible, and therewith oxygen concentration in the melt itself. Particularly, when the rotation number of the crucible is increased, a dissolving rate of the crucible is increased, which may lead to higher oxygen concentration in the silicon melt, resulting in higher oxygen concentration in the crystal. Accordingly, an oxygen concentration can be controlled to be constant by increasing the rotation number of the crucible according to the time of use of the heater.

The gas atmosphere in the furnace affects an amount Of SiO gas that is evaporated and scattered from the surface of the melt. When the atmosphere pressure in the furnace is high, SiO gas hardly evaporates so that oxygen concentration in the melt is increased, and thus oxygen concentration in the crystal is increased. On the other hand, when the amount of flowing inert gas is increased, evaporation of SiO gas from the surface of the melt is accelerated so that oxygen concentration in the crystal is decreased. Accordingly, an oxygen concentration can be controlled to be constant by increasing an atmosphere pressure in a furnace, or decreasing a flowing gas according to the time of use of the heater.

The temperature distribution of the melt, and especially the relative position of the heater and the crucible affects convection of the melt. When the relative position of the heater to the crucible is lowered, the forced convection 18 shown in FIG. 5 gets strong. When the relative position of the heater to the crucible is raised, the natural convection 19 gets strong. Accordingly, an oxygen concentration can be controlled to be constant by lowering the relative position of the heater to the crucible according to the time of use of the heater.

In that case, lowering of the relative position of the heater to the crucible is preferably achieved by moving the heater downwardly as shown in FIG. 4(C).

When control is conducted not by raising the crucible but by lowering the heater, exotherm dispersion of the heater to the melt becomes extremely close to original one as shown in FIG. 4(A). Accordingly, constant oxygen concentration can be achieved, and condition for growing single crystal ingot is substantially unchanged, and therefore operation can be conducted stably. Furthermore, it is necessary to control a diameter of a single crystal ingot in manufacture of the single crystal ingot by CZ method. If the crucible is raised in the method, the position of the surface of the melt is changed corresponding to the time of use of the heater, which makes it necessary to change a predetermined value of a sensor detecting the diameter and the like. Such an operation is troublesome, and not preferable.

Figure 1:
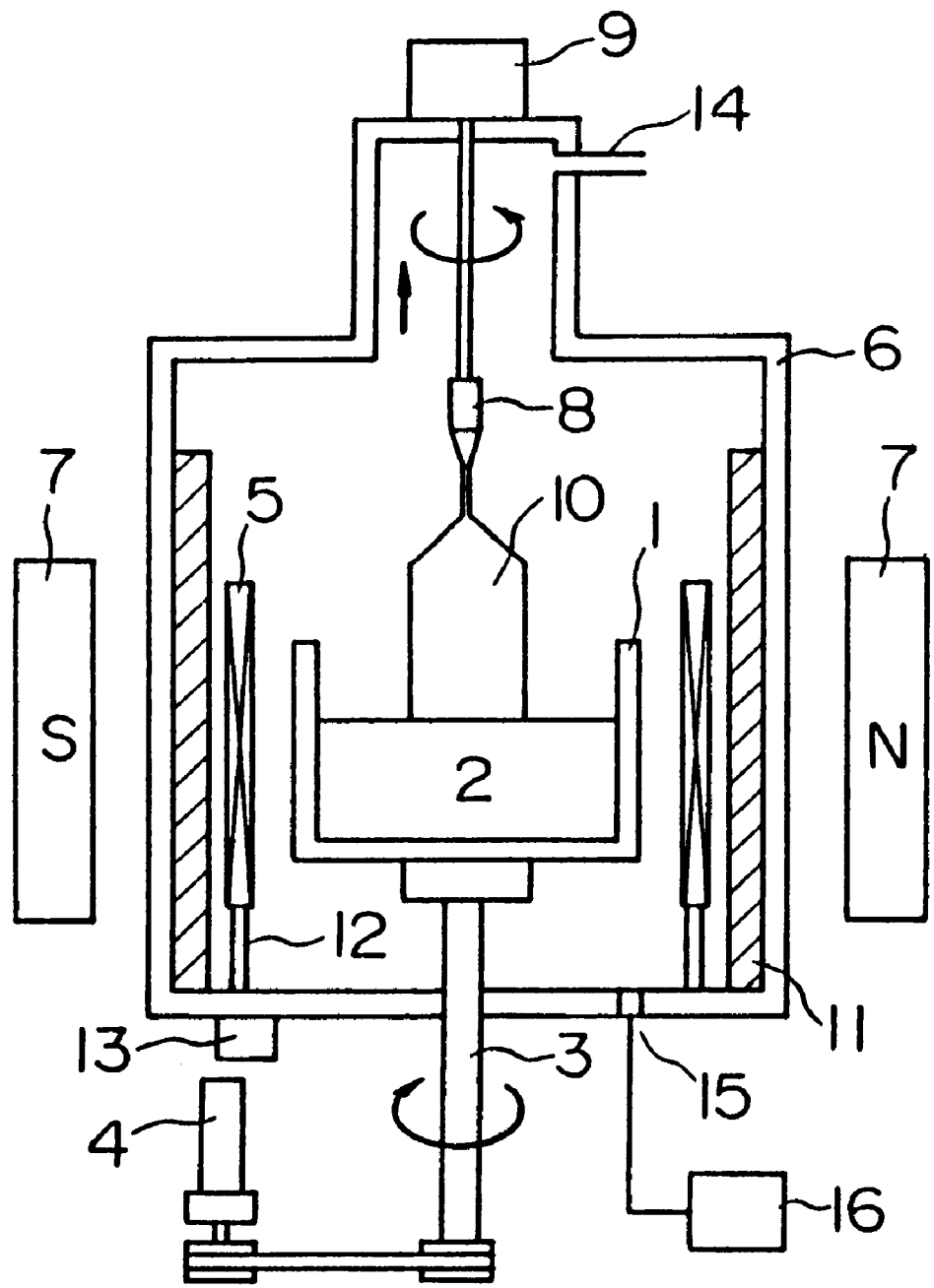
FIG. 1 is a schematic view of the apparatus for growing a single crystal by a typical CZ method.
Figure 2:
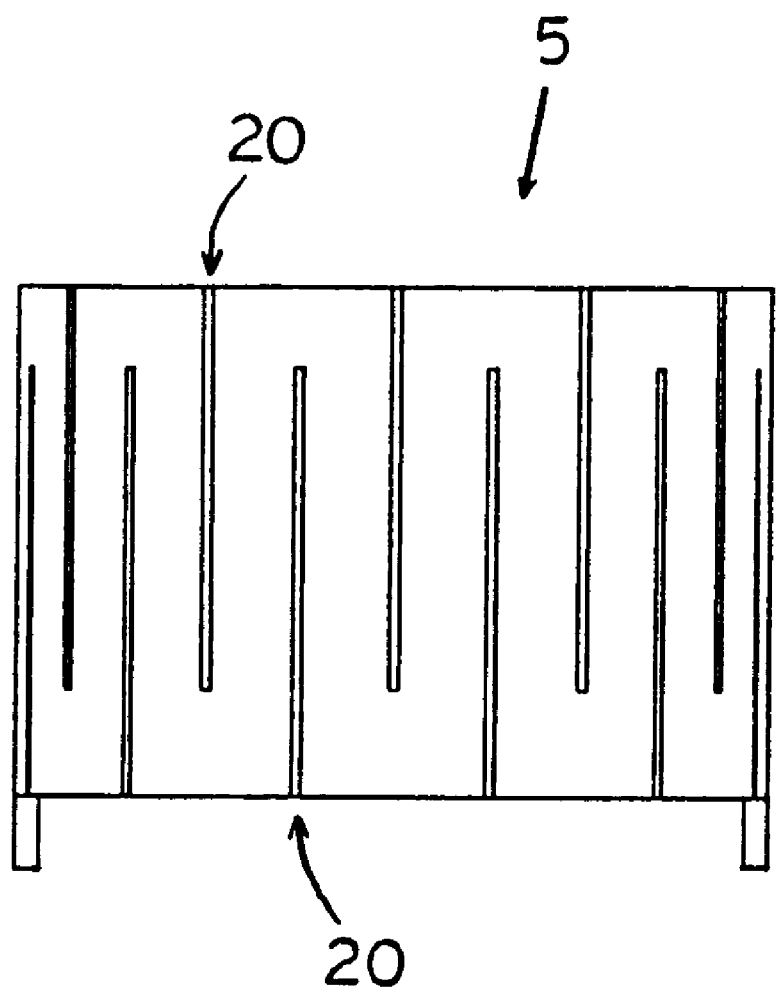
FIG. 2 is a side view of an example of a heater used in CZ method.

In order to control the position not by raising the crucible, but by lowering the heater, the pulling apparatus needs to be equipped with the mechanism for moving the heater as shown in FIG. 1 as a matter of course.

When the relative position of the heater to the crucible is lowered, it is preferable that it is controlled in a larger amount in the first half of crystal growth.

Because the influence of time of use of the heater on the impurity concentration and the influence of the relative position of the heater to the crucible is larger in the first half of crystal growth in which the melt is present in a large amount as shown in FIG. 3.

The reason of the above fact is not concrete, but may be as follows. An amount of silicon melt decreases in the latter half or later stage of crystal growing, and depth of the melt decreases so that convection hardly occurs. Accordingly, in the latter half of crystal growing, even if the relative position of the heater to the crucible is changed, or heating center is offset because of deterioration of the heater, influence on the above-mentioned forced convection and natural convection is small, since the melt is shallow. Accordingly, decrease of the oxygen concentration would be small, and necessary compensation would also be small.

EXAMPLE

The present invention will be explained with the following examples.

Example 1

A single crystal ingot was produced under the same condition as used for obtaining the data shown in FIG. 3. Namely, a silicon single crystal ingot having a diameter of 6 inches was manufactured with Czochralski method by feeding 50 kg of polycrystal material in a quartz crucible having a bore diameter of 18 inches and pulling a silicon single crystal ingot, with lowering a position of the heater according to time of use of a heater. Then, it was determined whether oxygen concentration can be corrected.

The apparatus having a heater which can move vertically as shown in FIG. 1 was used. The cumulative time of use of the heater was about 4900 hours.

As shown in FIG. 3, oxygen concentration to be decreased is estimated at about 1.2 ppma at the seed-end portion of the crystal, about 0.6 ppma at the center portion of the crystal, and about 0.4 ppma at the tail portion of the crystal. Accordingly, the position of the heater was controlled corresponding to the value to make oxygen concentration uniform.

Namely, the position of the heater to the crucible was relatively lowered to the position of 20 mm lower than the conventional position of the heater, and then growth of single crystal was initiated. While the crystal was grown, the relative position of the heater to the crucible was controlled to be 10 mm lower at the center portion and 10 mm lower at the tail portion than the conventional position.

Three single crystal ingots were grown with controlling the position of the heater in the manner described above. Oxygen concentration of the single crystal ingots thus produced was measured at the seed-end portion, at the center portion and at the tail portion. The results were shown in FIG. 3 as white circles.

From the results, it is clear that decrease of oxygen concentration can be corrected by controlling the relative position of the heater to the crucible according to time of use of a heater.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal is produced by CZ method. However, the present invention can be applied to correct dispersion of oxygen concentration due to deterioration of a heater, when pulling of a semiconductor other than silicon, compound semiconductor, oxide single crystal, or the like.

Furthermore, the present invention can be applied to not only Czochralski method but also MCZ method (Magnetic field applied Czochralski crystal growth method) wherein a magnetic field is applied to a melt when pulling a silicon single crystal as well. In the specification of the present invention, the term of Czochralski method means not only general Czochralski method but also MCZ method.

What is claimed is:

1. A method of producing a single crystal by Czochralski method comprising contacting a seed crystal with a melt in a crucible, and then pulling it slowly to grow a single crystal ingot, wherein a pulling condition is controlled according to a cumulative time of use of a heater surrounding the crucible.

2. The method of producing a single crystal by Czochralski method according to claim 1, wherein the pulling condition to be controlled is at least one of relative position of a heater to a crucible, number of rotation of a crucible, number of rotation of a crystal, an atmosphere pressure in a furnace and an amount of flowing gas.

3. The method of producing a single crystal by Czochralski method according to claim 2, wherein the pulling condition is controlled by lowering a relative position of the heater to the crucible according to the cumulative time of use of the heater.

4. The method of producing a single crystal by Czochralski method according to claim 3, wherein the control of the relative position of the heater to the crucible is performed by lowering the position of the heater.

5. The method of producing a single crystal by Czochralski method according to claim 4, wherein the relative position of the heater to the crucible is controlled in a manner that it is controlled in a larger amount in the first half of crystal growth.

6. The method of producing a single crystal by Czochralski method according to claim 3, wherein the relative position of the heater to the crucible is controlled in a manner that it is controlled in a larger amount in the first half of crystal growth.

7. The method of producing a single crystal by Czochralski method according to claim 1, wherein the pulling condition is controlled by lowering a relative position of the heater to the crucible according to the cumulative time of use of the heater.

8. The method of producing a single crystal by Czochralski method according to claim 7, wherein the control of the relative position of the heater to the crucible is performed by lowering the position of the heater.

9. The method of producing a single crystal by Czochralski method according to claim 8, wherein the relative position of the heater to the crucible is controlled in a manner that it is controlled in a larger amount in the first half of crystal growth.

10. The method of producing a single crystal by Czochralski method according to claim 7, wherein the relative position of the heater to the crucible is controlled in a manner that it is controlled in a larger amount in the first half of crystal growth.

* * * * *